(12) United States Patent
Parry et al.

(10) Patent No.: US 11,380,419 B1
(45) Date of Patent: Jul. 5, 2022

(54) METHODS TO LIMIT POWER DURING STRESS TEST AND OTHER LIMITED SUPPLIES ENVIRONMENT

(71) Applicant: Micron Technology, Inc., Boise, ID (US)

(72) Inventors: Jonathan Scott Parry, Boise, ID (US); Deping He, Boise, ID (US); Giuseppe Cariello, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 18 days.

(21) Appl. No.: 17/125,503

(22) Filed: Dec. 17, 2020

(51) Int. Cl.
*G11C 29/50* (2006.01)
*G11C 29/56* (2006.01)
*G11C 5/14* (2006.01)

(52) U.S. Cl.
CPC ............. *G11C 29/50* (2013.01); *G11C 5/147* (2013.01); *G11C 29/56* (2013.01)

(58) Field of Classification Search
CPC .................................................. G11C 29/50
USPC ........................................................ 365/201
See application file for complete search history.

(56) References Cited

U.S. PATENT DOCUMENTS

| | | | |
|---|---|---|---|
| 2003/0067828 A1* | 4/2003 | Janzen | G11C 11/406 365/222 |
| 2010/0225240 A1* | 9/2010 | Shearer | H05B 47/185 315/246 |
| 2012/0155168 A1* | 6/2012 | Kim | G11C 5/14 365/185.23 |
| 2021/0203231 A1* | 7/2021 | Lula | H02M 1/0025 |

* cited by examiner

*Primary Examiner* — Muna A Techane
(74) *Attorney, Agent, or Firm* — Schwegman Lundberg & Woessner, P.A.

(57) ABSTRACT

A memory device comprises a memory array that includes memory cells and a memory controller operatively coupled to the memory array. The memory controller includes an oscillator circuit, internal memory, a processor core coupled to the oscillator circuit and the internal memory, and configured to load operating firmware during a boot phase of the memory device, voltage detector circuitry configured to detect a decrease in a circuit supply voltage of the memory controller during the boot phase, and logic circuitry configured to halt operation of the oscillator circuit and power down the processor core and the internal memory during the boot phase in a low power mode in response to detecting the decrease in the circuit supply voltage.

25 Claims, 7 Drawing Sheets

US 11,380,419 B1

METHODS TO LIMIT POWER DURING STRESS TEST AND OTHER LIMITED SUPPLIES ENVIRONMENT

Embodiments of the disclosure relate to memory devices, and more specifically relate to a memory device that limits demand on the device power supply during power up.

BACKGROUND

Memory devices are typically provided as internal, semiconductor, integrated circuits in computers or other electronic devices. There are many different types of memory including volatile and non-volatile memory. Volatile memory can require power to maintain data and includes random-access memory (RAM), dynamic random-access memory (DRAM), and synchronous dynamic random-access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random-access memory (RRAM), and magnetoresistive random access memory (MRAM), 3D XPoint™ memory, among others.

Memory cells are typically arranged in a matrix or an array. Multiple matrices or arrays can be combined into a single die memory device, and multiple memory die can be combined with controller functionality into a composite memory device, such as a solid-state drive (SSD), a Universal Flash Storage (UFS™) device, a MultiMediaCard (MMC) solid-state storage device, an embedded MMC device (eMMC™), etc., as discussed further below.

During their development, memory devices are subject to verification testing including stress testing. The testing can cause issues with drain on the power supply that result in brown outs and rebooting of the test system. There is a benefit to minimizing the test time needed to verify the operation of memory devices.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
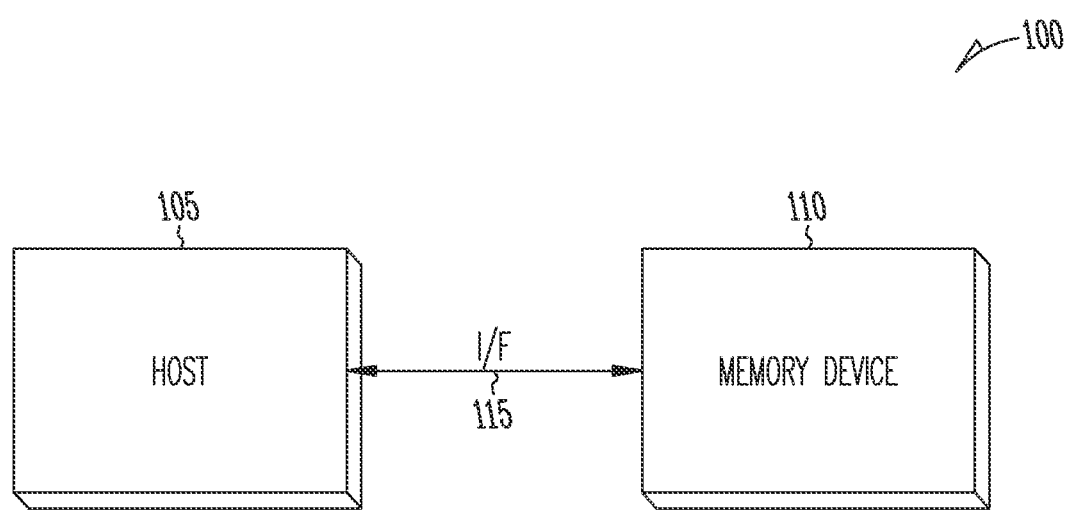
FIG. 1 illustrates an example system including a host and a memory device according to some examples described herein.

Memory devices can include arrays of memory cells. Managed memory devices can include a memory controller to control or manage access to the memory arrays according to one or more memory management protocols. During their development, memory devices are subject to verification testing including stress testing. The testing can be performed on multiple memory devices in parallel, though such parallel testing can cause issues with drain on the circuit supply that result in brown outs that cause the need to reboot the test system multiple times during the testing.

Memory devices include individual memory die, which may, for example, include including a storage region comprising one or more arrays of memory cells, implementing one (or more) selected storage technologies. Such memory die will often include support circuitry for operating the memory array(s) on the die. Other examples, sometimes known generally as "managed memory devices," include assemblies of one or more memory die associated with controller functionality configured to control operation of the one or more memory die. Such controller functionality can simplify interoperability with an external device, as a "host" device as discussed later herein. In such managed memory devices, the controller functionality may be implemented on one or more die also incorporating a memory array, or may be a separate assembly on a separate die. In other examples, one or more memory devices may be combined with controller functionality to form a solid-stage drive (SSD) storage volume.

Embodiments of the present disclosure are described in the example of managed memory devices implementing NAND flash memory cells. These examples, however, are not limiting on the scope of the disclosure, which may be implemented in other forms of memory devices and/or with other forms of storage technology.

Both NOR and NAND flash architecture semiconductor memory arrays are accessed through decoders that activate specific memory cells by selecting the word line coupled to their gates. In a NOR architecture semiconductor memory array, once activated, the selected memory cells place their data values on bit lines, causing different currents to flow depending on the state at which a particular cell is programmed. In a NAND architecture semiconductor memory array, a high bias voltage is applied to a drain-side select gate (SGD) line. Word lines coupled to the gates of the unselected memory cells of each group are driven at a specified pass voltage (e.g., Vpass) to operate the unselected memory cells of each group as pass transistors (e.g., to pass current in a manner unrestricted by their stored data values). Current then flows from the source line to the bit line through each series coupled group, restricted only by the selected memory cells of each group, placing current encoded data values of selected memory cells on the bit lines.

Each flash memory cell in a NOR or NAND architecture semiconductor memory array can be programmed individually or collectively to one or a number of programmed states. For example, a single-level cell (SLC) can represent one of two programmed states (e.g., 1 or 0), representing one bit of data. Flash memory cells can also represent more than two programmed states, allowing the manufacture of higher density memories without increasing the number of memory cells, as each cell can represent more than one binary digit (e.g., more than one bit). Such cells can be referred to as multi-state memory cells, multi-digit cells, or multi-level cells (MLCs). In certain examples, MLC can refer to a memory cell that can store two bits of data per cell (e.g., one of four programmed states), a triple-level cell (TLC) can refer to a memory cell that can store three bits of data per cell (e.g., one of eight programmed states), and a quad-level cell (QLC) can store four bits of data per cell. MLC is used herein in its broader context, to refer to any memory cell(s) that can store more than one bit of data per cell (i.e., that can represent more than two programmed states).

Managed memory devices may be configured and operated in accordance with recognized industry standards. For example, managed NAND devices may be (as non-limiting examples), a Universal Flash Storage (UFS™) device, or an embedded MMC device (eMMC™), etc. For example, in the case of the above examples, UFS devices may be configured in accordance with Joint Electron Device Engineering Council (JEDEC) standards (e.g., JEDEC standard JESD223D, entitled JEDEC UFS Flash Storage 3.0, etc., and/or updates or subsequent versions to such standard. Similarly, identified eMMC devices may be configured in accordance with JEDEC standard JESD84-A51, entitled "JEDEC eMMC standard 5.1", again, and/or updates or subsequent versions to such standard.

An SSD can be used as, among other things, the main storage device of a computer, having advantages over traditional hard drives with moving parts with respect to, for example, performance, size, weight, ruggedness, operating temperature range, and power consumption. For example, SSDs can have reduced seek time, latency, or other delay associated with magnetic disk drives (e.g., electromechanical, etc.). SSDs use non-volatile memory cells, such as flash memory cells to obviate internal battery supply requirements, thus allowing the drive to be more versatile and compact. Managed memory devices, for example managed NAND devices, can be used as primary or ancillary memory in various forms of electronic devices, and are commonly used in mobile devices.

Both SSDs and managed memory devices can include a number of memory devices, including a number of dies or logical units (e.g., logical unit numbers or LUNs), and can include one or more processors or other controllers performing logic functions required to operate the memory devices or interface with external systems. Such SSDs and managed memory devices can include one or more flash memory die, including a number of memory arrays and peripheral circuitry thereon. The flash memory arrays can include a number of blocks of memory cells organized into a number of physical pages. In some examples, the SSDs can also include DRAM or SRAM (or other forms of memory die or other memory structures). Similarly, managed NAND devices can include one or more arrays of volatile and/or nonvolatile memory separate from the NAND storage array, and either within or separate from a controller. Both SSDs and managed NAND devices can receive commands from a host in association with memory operations, such as read or write operations to transfer data (e.g., user data and associated integrity data, such as error data and address data, etc.) between the memory devices and the host, or erase operations to erase data from the memory devices.

FIG. 1 illustrates an example system 100 including a host 105 and a memory device 110. The host 105 can include a host processor, a central processing unit, or one or more other device, processor, or controller. The memory device 110 can include one or more other memory devices, or the communication interface 115 can include one or more other interfaces, depending on the host 105 and the memory device 110.

Each of the host 105 and the memory device 110 can include a number of receiver or driver circuits configured to send or receive signals over the communication interface 115, or interface circuits, such as data control units, sampling circuits, or other intermedia circuits configured to process data to be communicated over, or otherwise process data received from the communication interface 115 for use by the host 105, the memory device 110, or one or more other circuits or devices.

The memory device 110 can include a memory array (e.g., one or more arrays of memory cells, such as a NAND flash memory array, or one or more other memory arrays), a memory control unit, and in certain examples, an interface circuit between the memory array and the memory control unit. In certain examples, the memory device can include a number of memory die, each having control logic separate from the memory control unit. The memory control unit can include an application specific integrated circuit (ASIC), a field programmable gate array (FPGA), or one or more other processing circuits arranged or programmed to manage data transfers or operations to, from, or within the memory array.

Figure 2:
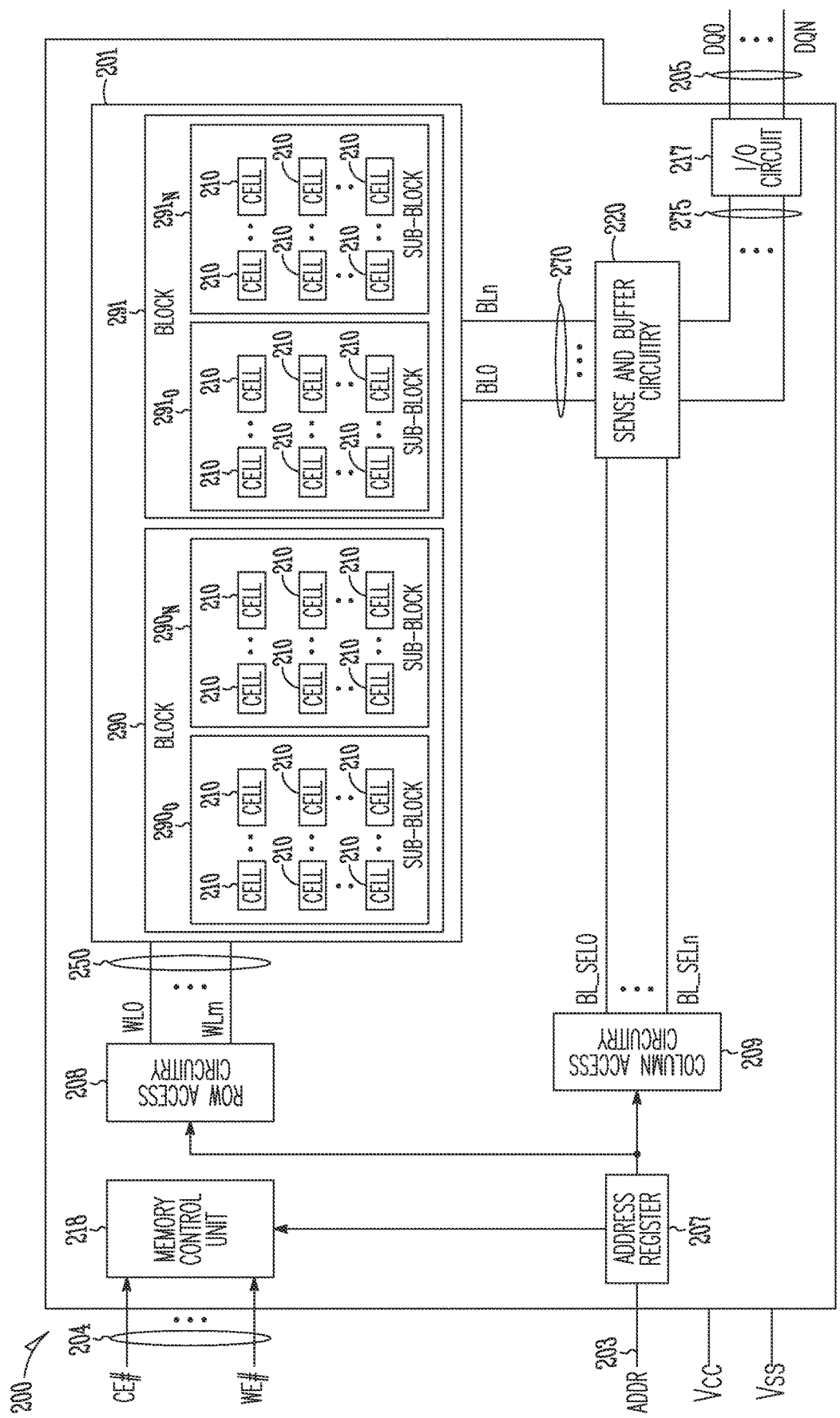
FIG. 2 is a block diagram of an apparatus in the form of a memory device including non-volatile memory cells according to some examples described herein.

FIG. 2 shows a block diagram of an example memory device 200 suitable for use as memory device 110 in FIG. 1. Alternatively, memory device 200 may be used in a managed memory device as discussed in reference to FIG. 3, in which one or more of the identified memory dies 301 may be examples of memory die 200. The memory device 200 can include non-volatile memory cells having mixed memory cell types integrated in the same integrated circuit (IC) chip, according to some examples described herein. Memory device 200 can include a memory array (or multiple memory arrays) 201 containing memory cells 210. In the physical structure of memory device 200, memory cells 210 can be arranged vertically (e.g., stacked over each other) over a substrate of memory device 200 (e.g., a semiconductor substrate of an IC chip that includes memory device 200). Memory cells 210 can include non-volatile cells and can have different non-volatile memory cell types. For example, memory cells 210 can include floating gate memory cells, charge trap memory cells, or other types of non-volatile memory cells, such as any of ferroelectric memory cells, phase change memory cells, variable resistance memory cells, conductive bridge memory cells, and spin-transfer-torque magnetic random access memory (STT-MRAM) cells, or memory cells implementing other types of non-volatile storage technology.

As shown in FIG. 2, memory cells 210 and 285 can be arranged in blocks (memory cell blocks), such as blocks 290 and 291. Each of blocks 290 and 291 can include sub-blocks. For example, block 290 can include sub-blocks $290_0$ and $290_n$, and block 291 can include sub-blocks $291_0$ and $291_n$. Each of sub-blocks $290_0$, $290_n$, $291_0$, and $291_n$ can include a combination of memory cells 210 and 285. FIG. 2 shows memory device 200 having two blocks 290 and 291 and two sub-blocks in each of the blocks as an example. Memory device 200 can have more than two blocks and more than two sub-blocks in each of the blocks.

The memory cells can be included in memory planes. Different portions of a memory die can be referred to as different planes or plane groups (e.g., a group of two or more planes can constitute a plane group) of a same die. In an illustrative example intended to be non-limiting a memory device may include four memory dies with each die having two planes for a total of eight planes. Commands to the different planes of the same die may execute simultaneously. The memory cells 210 and 285 can be arranged in, for example, a number of devices, semi-conductor dies, planes, sub-blocks, blocks, or pages. More than one plane, sub-block, block, or page can be included on one memory die.

As shown in FIG. 2, memory device 200 can include access lines (which can include word lines) 250 and data lines (which can include bit lines) 270. Access lines 250 can carry signals (e.g., word line signals) WL0 through WLm. Data lines 270 can carry signals (e.g., bit line signals) BL0 through BLn. Memory device 200 can use access lines 250 to selectively access sub-blocks $290_0$, $290_n$, $291_0$, and $291_n$ of blocks 290 and 291 and data lines 270 to selectively exchange information (e.g., data) with memory cells 210 of blocks 290 and 291.

Memory device 200 can include an address register 207 to receive address information (e.g., address signals) ADDR on lines (e.g., address lines) 203. Memory device 200 can include row access circuitry 208 and column access circuitry 209 that can decode address information from address register 207. Based on decoded address information, memory device 200 can determine which memory cells 210 of which sub-blocks of blocks 290 and 291 are to be accessed during a memory operation. Memory device 200 can perform a read operation to read (e.g., sense) information (e.g., previously stored information) in memory cells 210, or a write (e.g., program) operation to store (e.g., program) information in memory cells 210. Memory device 200 can use data lines 270 associated with signals BL0 through BLn to provide information to be stored in memory cells 210 or obtain information read (e.g., sensed) from memory cells 210. Memory device 200 can also perform an erase operation to erase information from some or all of memory cells 210 of blocks 290 and 291.

Memory device 200 can include a memory control unit 218 (which can include processing circuitry components such as processor 219, a state machine (e.g., finite state machine), register circuits, and other components) configured to control memory operations (e.g., read, write, and erase operations) of memory device 200 based on control signals on lines 204. Examples of the control signals on lines 204 include one or more clock signals and other signals (e.g., a chip enable signal CE#, a write enable signal WE#) to indicate which operation (e.g., read, write, erase operation, erase-verify operation) memory device 200 can perform. The memory control unit 218 can be included in the same integrated circuit chip as the memory cells. In some examples, the memory cells are NAND memory cells included in an integrated circuit die and the memory control unit 218 is included in an application specific integrated circuit or ASIC.

Memory device 200 can include sense and buffer circuitry 220 that can include components such as sense amplifiers and page buffer circuits (e.g., data latches). Sense and buffer circuitry 220 can respond to signals BL_SEL0 through BL SELn from column access circuitry 209. Sense and buffer circuitry 220 can be configured to determine (e.g., by sensing) the value of information read from memory cells 210 (e.g., during a read operation) of blocks 290 and 291 and provide the value of the information to lines (e.g., global data lines) 275. Sense and buffer circuitry 220 can also can be configured to use signals on lines 275 to determine the value of information to be stored (e.g., programmed) in memory cells 210 of blocks 290 and 291 (e.g., during a write operation) based on the values (e.g., voltage values) of signals on lines 275 (e.g., during a write operation).

Memory device 200 can include input/output (I/O) circuitry 217 to exchange information between memory cells 210 of blocks 290 and 291 and lines (e.g., I/O lines) 205. Signals DQ0 through DQN on lines 205 can represent information read from or stored in memory cells 210 of blocks 290 and 291. Lines 205 can include nodes within memory device 200 or pins (or solder balls) on a package where memory device 200 can reside. Other devices external to memory device 200 (e.g., a managed memory controller, an external memory controller, or a processor) can communicate with memory device 200 through lines 203, 204, and 205. For the example of FIG. 2, the memory device 200 will be discussed as a 3D NAND memory device, including multiple strings of serially connected NAND memory cells.

Each of memory cells 210 can be programmed individually or collectively to one or a number of programmed states. For example, a single-level cell (SLC) can represent one of two programmed states (e.g., 1 or 0), representing one bit of data. However, flash memory cells can also be multi-level cells (MLCs) that represent one of more than two programmed states, allowing the manufacture of higher density memories without increasing the number of memory cells, as each cell can represent more than one binary digit (e.g., more than one bit).

In another example, each of memory cells 210 can be programmed to store information representing a value for multiple bits, such as one of four possible values "00", "01", "10", and "11" of two bits, one of eight possible values "000", "001", "010", "011", "100", "101", "110", and "111" of three bits, or one of other values of another number of multiple bits. A cell that has the ability to store multiple bits is sometimes called a multi-level cell (or multi-state cell). MLC is used herein in its broader context, to refer to any memory cell that can store more than one bit of data per cell (i.e., that can represent more than two programmed states, including a triple-level cell (TLC) can refer to a memory cell that can store three bits of data per cell (e.g., one of eight programmed states), and a quad-level cell (QLC) can store four bits of data per cell). One of ordinary skill in the art may recognize that memory device 200 may include other components not shown in FIG. 2 so as not to obscure the example embodiments described herein.

Memory device 200 can receive a circuit supply voltage, including supply voltages Vcc and Vss. Supply voltage Vss can operate at a ground potential (e.g., having a value of approximately zero volts). Supply voltage Vcc can include an external voltage supplied to memory device 200 from an external power source such as a battery or alternating current to direct current (AC-DC) converter circuitry.

Figure 3:
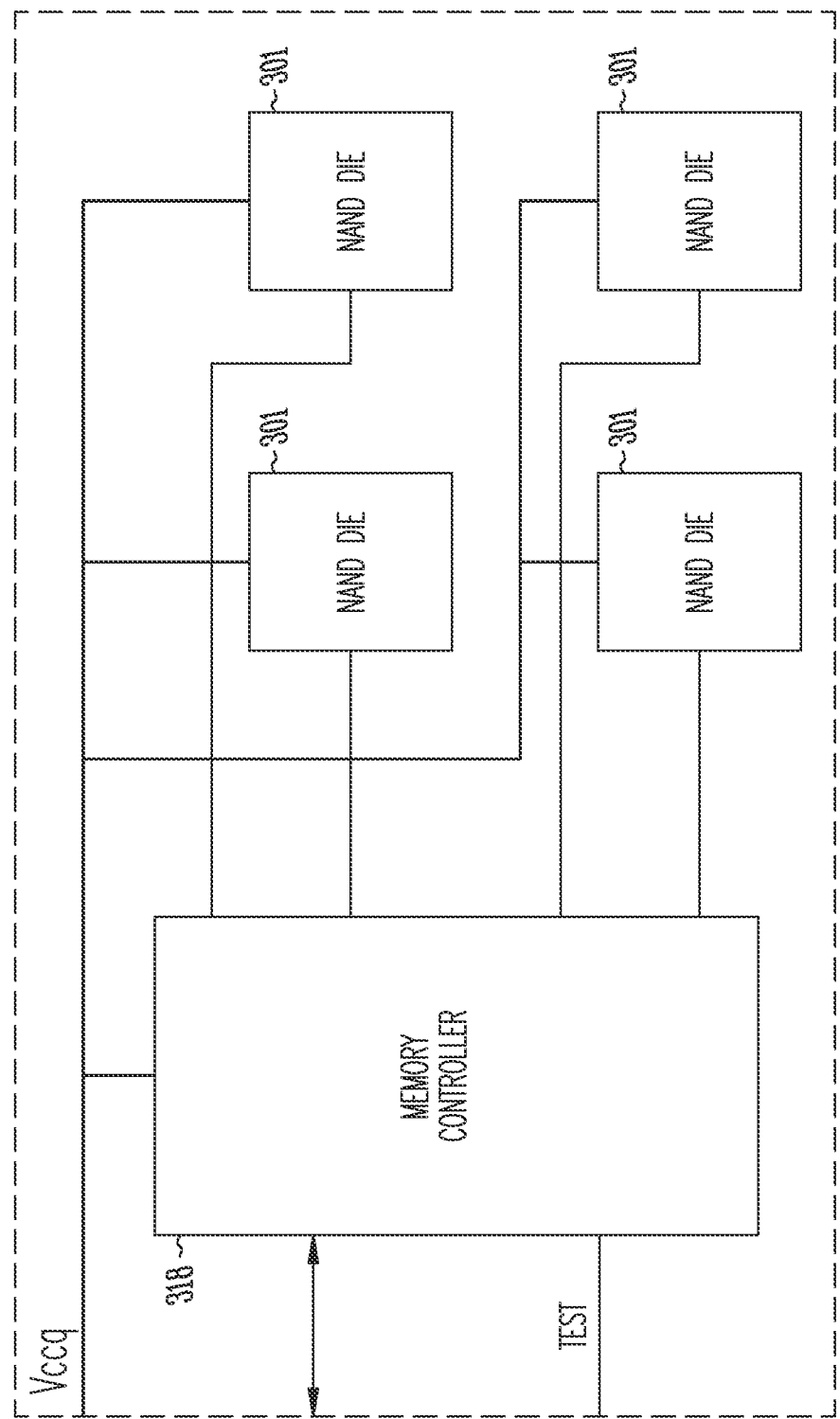
FIG. 3 is a block diagram of an example of a memory device according to some examples described herein.

FIG. 3 is a block diagram of an example of a memory device, such as memory device 200 in FIG. 2 or memory device 110 in FIG. 1. For purposes of the present description, memory device 300 will be described as a managed memory device, having multiple memory dies 301 controlled by a memory controller 318 which communicates with external devices/systems. As described previously, the managed memory device may have a configuration compliant with different memory standards, for example UFS or MMC standards, as discussed earlier herein.

The memory controller 318 can be included in an ASIC separate from and external to the memory die or dies 301. The memory controller can include a processor core, internal memory, and peripheral circuitry that is used to transfer data between the NAND die and the memory controller according to one or more memory protocols (e.g., the Open NAND Flash Interface (ONFI) standard protocol). Upon power-up, operating firmware is loaded into the processor core (e.g., from internal memory) as part of a boot phase of the memory device and the processor core begins to perform instructions included in the firmware.

Figure 4:
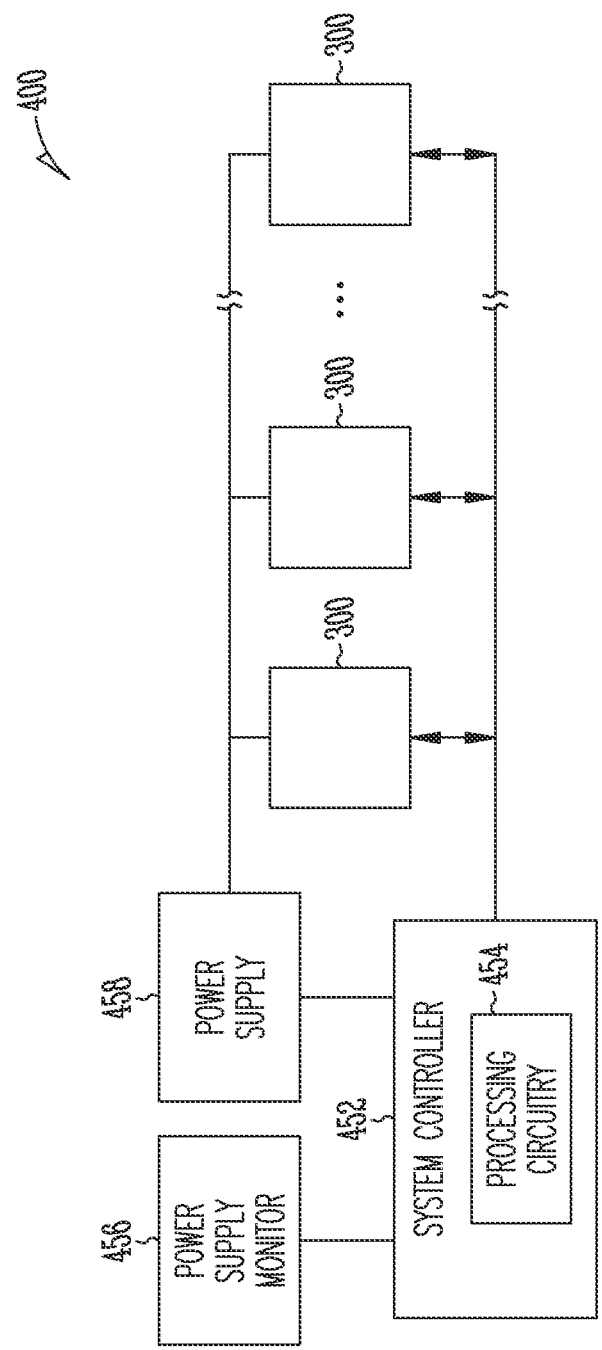
FIG. 4 is a block diagram of an electronic system according to some examples described herein.

FIG. 4 is a block diagram of an electronic system 400. The electronic system 400 includes a system controller 452 and multiple memory devices, such as memory device 300 of FIG. 3. In some examples, the electronic system 400 is a test system. During development, the memory devices 300 are subject to verification testing. To reduce the cost of testing, many memory devices 300 are tested in parallel. The system controller 452 can include processing circuitry 454 that includes one or more processors. The processing circuitry 454 controls memory requests and responses to verify operation of the memory devices 300.

The electronic system includes a power supply 458 and a power supply voltage monitor circuit. The verification testing can include stress testing that includes multiple power-up cycles. As the many memory devices progress through power-up and the boot phase at the same time, the electronic system 400 can experience excessive demand on circuit supplies that can cause brown outs to the power supply of the system. This can result in test technicians having to reboot the system many times during the stress testing phase. A solution is to maintain the power level of the memory devices to a minimum level as the devices complete their boot phase.

Figure 5:
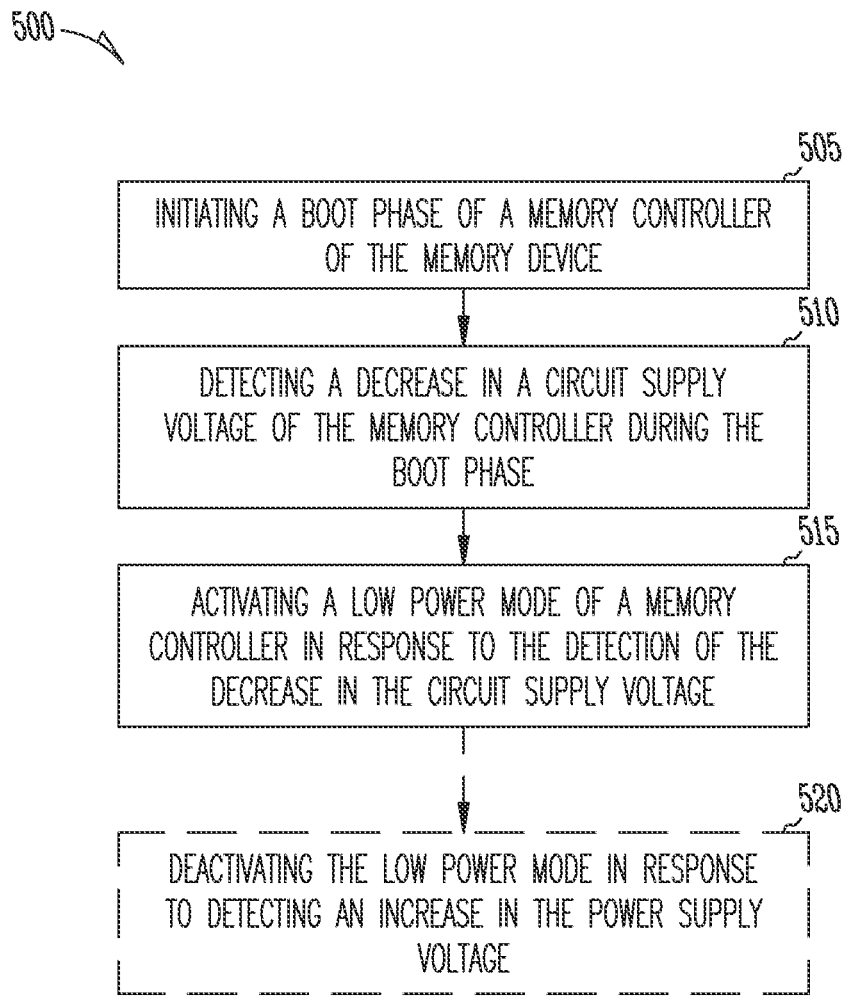
FIG. 5 is a flow diagram of an example of a method of operating a memory device according to some examples described herein.

FIG. 5 is a flow diagram of an example of a method 500 of operating an electronic system, such as the electronic system in the example of FIG. 4. For purposes of the present description, the example method will be described in context of a managed memory device such as the memory device 300 of FIG. 3. At 505, a boot phase of the memory controllers of the memory devices of the system is initiated. The memory controllers may be external memory controllers external to the memory die or dies of the memory device. The boot phase may be initiated as part of reset of a memory controller or following reset of the memory controller. The operating firmware is loaded into the processor or processor core of a memory controller during the boot phase.

At 510, a decrease in the power supply 458 is detected by the power supply voltage monitor 456 during the boot phase of the memory controllers. The decrease in the power supply voltage indicates that there may be excessive demand on the power supply. At 515, a low power mode of the memory controllers is activated in response to the detection of the decrease in the power supply voltage. A memory controller may enter the low power mode in response to receive a low power control signal from the system controller 452. A memory controller can include an oscillator circuit used to derive clock signals, an internal memory. When the memory controller is in the low power mode, the oscillator circuit of the memory controller is halted, and the processor core and internal memory of the memory controller are powered down. In some examples, a memory controller includes peripheral circuitry and the peripheral circuitry of the memory controller is also powered down.

The low power mode temporarily alleviates the demand on the power supply due to the load caused by the memory devices. When recovery of the power supply 458 is detected (e.g., the power supply voltage starts to increase), the boot phase can be resumed. At 520, the system controller 452 may deactivate the low power mode in the memory controllers by deactivating the low power control signal when detecting an increase in the power supply voltage or the power supply voltage increases above a threshold.

In some examples, the system controller 452 sends the low power control signal to all the memory controllers of the memory devices under test to place all of the memory controllers in the low power mode in response to the detected decrease in power supply voltage. In some examples, the threshold may be sent for triggering the low power mode; for example, at a voltage level between the intended voltage of power supply 458 and a voltage level at which brown outs and/or boot issues are expected to occur. In some other examples, the system controller 452 sends the low power control signal to a portion of the memory devices in response to the detected decrease in supply voltage. If the power supply does not recover, such as to a threshold level, the system controller sends the low power control signal to another portion of the memory devices. In certain examples, the memory devices are placed in low power mode one at a time. The low power control signal or signals are de-asserted and the memory devices are released from low power mode when the voltage of the power supply recovers. In some examples, the low power control signals are de-asserted in the reverse order from which they were asserted.

In some examples, the monitoring of the power supply voltage may be performed by the memory controllers. The memory controllers include voltage detection circuitry to monitor the power supply voltage. The memory controllers detect the decrease in the power supply voltage during the boot phase, and each memory controller automatically enters the low power mode in response to its detection of the decrease in power supply voltage.

Figure 6:
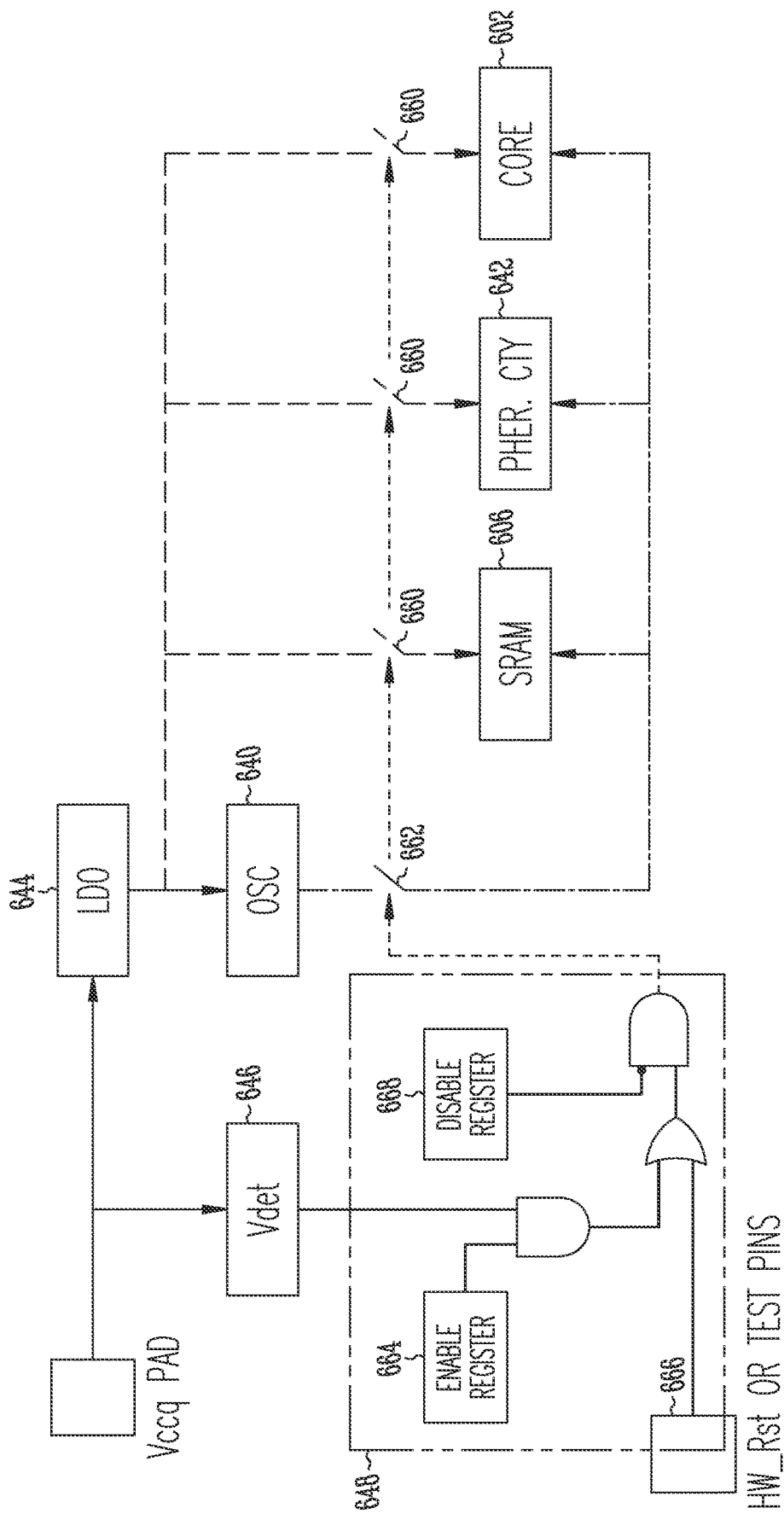
FIG. 6 is a block diagram of an example of a portion of a memory controller according to some examples described herein.

FIG. 6 is a block diagram of an example of a portion of a memory controller, such as the memory controller 318 of managed memory device 300 of FIG. 3, in which the memory controller can detect a supply voltage decrease and place itself in low power mode. The memory controller includes an oscillator circuit 640, internal memory 606, a processor core 602, and peripheral circuitry 642. The memory controller performs a boot phase when powering up. During the execution of the boot phase, operating firmware is loaded into the processor core 602 (e.g., from NAND memory 301 into internal memory 606). A circuit supply (Vccq) is provided to a low dropout (LDO) regulator 644 which provides a regulated supply to the oscillator circuit 640, internal memory 606, a processor core 602, and peripheral circuitry 642.

The memory controller also includes voltage detector circuitry 646 that detects a decrease in the circuit supply voltage Vccq during the boot phase. The voltage detector circuitry 646 may include one or more comparators to detect voltage levels of the circuit supply. The memory controller also includes logic circuitry 648 to cause the memory controller to enter a low power mode in response to the voltage detector circuitry 646 detecting a decrease in the circuit supply voltage. In the low power mode, the logic circuitry halts operation of the oscillator circuit 640. This can be done by stopping transitions in the clock signal produced by the oscillator or by not providing the clock signal to the internal memory 606, the processor core 602, and the peripheral circuitry 642. Also in the low power mode, the processor core 602 and the internal memory 606 are powered down. The peripheral circuitry 642 may also be powered down. In the example, of FIG. 6, the low power mode is shown as the logic circuitry 648 opening the switches 660 between the LDO 644 and the internal memory 606, a processor core 602, and peripheral circuitry 642, and opening the switch 662 to remove the clock from the internal memory 606, a processor core 602, and peripheral circuitry 642.

The logic circuitry 648 can include an enable register 664. When the enable register is set to one or high, it enables the voltage detector circuitry 646 to trigger the low power mode. The enable register 664 may be initialized to zero or low to disable the voltage detector circuitry 646 from triggering the low power mode during the power ramp up, and the enable register 664 may be set to one or high after initialization of the voltage detector circuitry 646 (e.g., after the circuitry completes power up).

The low power mode allows the circuit supply voltage to recover. In some examples, the voltage detector circuitry 646 detects recovery of the circuit supply when detecting an increase in the circuit supply voltage after detecting the decrease in circuit supply voltage. In some examples, the voltage detector circuitry 646 detects recovery of the circuit supply when detecting that the circuit supply voltage stops decreasing. When the circuit supply voltage recovers and the low voltage detection is no longer asserted, the logic circuitry restores power to the processor core 602, the internal memory 606, and the peripheral circuitry 642, and enables operation of the oscillator circuit 640. This low power mode may cause a pause in the increase of the circuit supply voltage after an initial increase in the circuit supply voltage. After recovery, the circuit supply voltage may continue to increase until the circuitry of the memory controller is initialized and the boot phase is completed.

The logic circuitry 648 can include a disable register 668. When the disable register 668 is cleared to zero or low, it enables the voltage detector circuitry 646 to trigger the low power mode. When the disable register is set to one or high, the voltage detector circuitry 646 is disabled from triggering the low power mode. The disable register may be initialized to zero, and may be set to disable the low voltage detection when the boot phase is complete. This can be done by the processor core 602 performing a firmware instruction or instructions to set the disable register.

As shown in FIG. 6, the low power mode can be initiated or ended in response to a signal applied to an input/output (I/O) pad 666 or pin of the memory controller. This can allow another device (e.g., a test device or a host device) to initiate and terminate the low power mode in the memory controller. The other device may have detection circuitry to detect excessive demand on the circuit supply of the memory controller and activate the low power mode using the I/O pad or pin in response to the detecting. The other device may be a test device operatively coupled to a circuit supply pin and a test pin. The test device may place the memory controller in a low power mode in response to a decrease in voltage on the circuit supply pin by applying a low power mode activation signal on the test pin.

In some examples, the memory controller includes a reset pin and the low power mode is activated as part of a reset process of the memory controller. In some examples, the low power mode is activated by the voltage detector circuitry 646 detecting that the circuit supply voltage decreases after initially increasing after a reset signal is received from the external device.

The methods, devices, and systems described herein can be used to prevent system brown outs and avoid power up failures. This can be of particular benefit in a testing environment, in which a test configuration will perform functional and stress testing on multiple devices, such as multiple managed memory devices in parallel. Booting such devices simultaneously can result in short-term low-voltage conditions which potentially can require multiple boot cycles, thereby reducing efficiency of the testing. The startup of any system that includes a memory controller can be improved to temporarily alleviate the load on the circuit supply caused by booting the memory controller.

Figure 7:
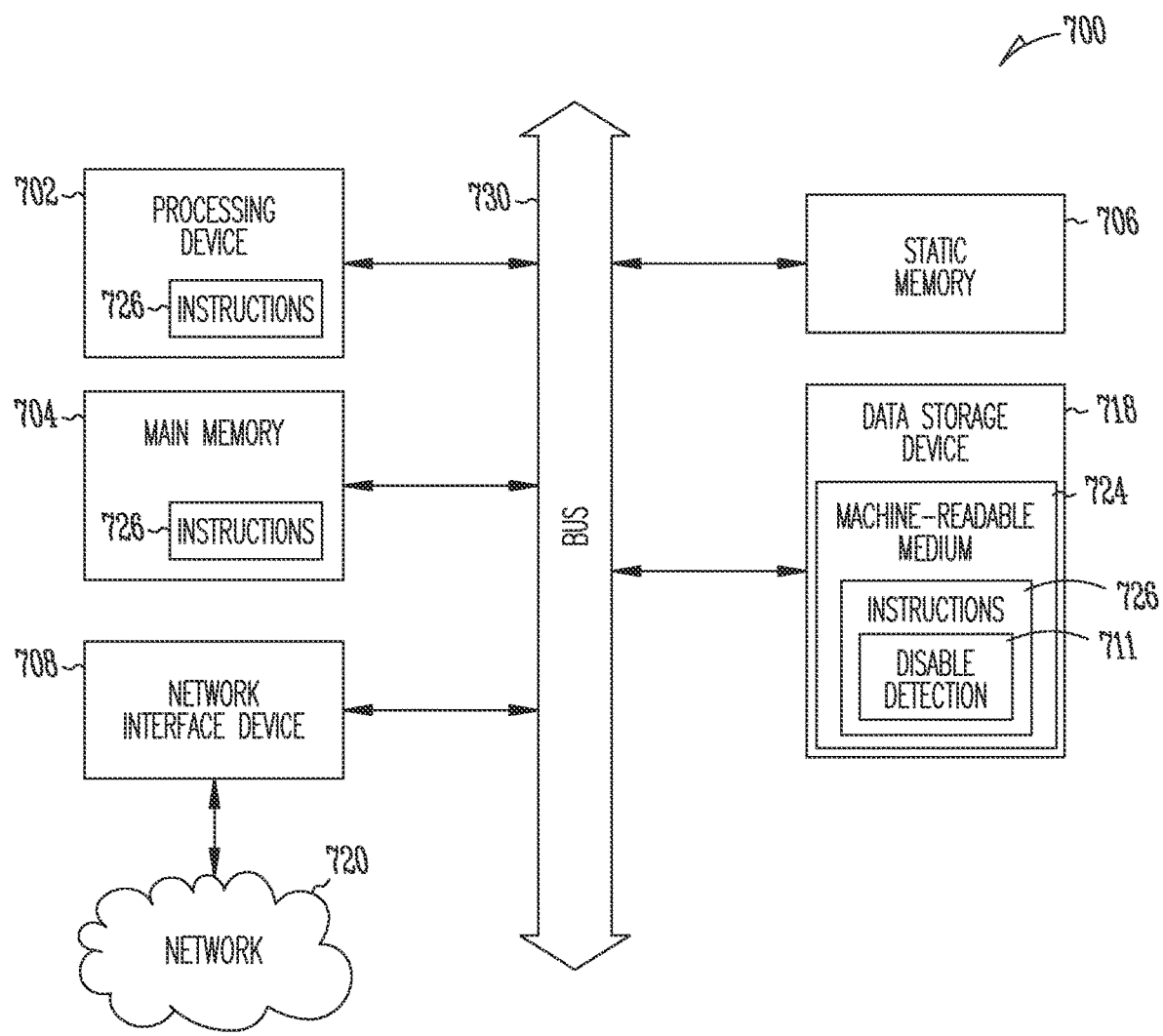
FIG. 7 illustrates a block diagram of an example machine according to some examples described herein.

FIG. 7 illustrates a block diagram of an example machine 700 upon which any one or more of the techniques (e.g., methodologies) discussed herein may perform, such as the described low power for example. In alternative examples, the machine 700 may operate as a standalone device or may be connected (e.g., networked) to other machines. In a networked deployment, the machine 700 may operate in the capacity of a server machine, a client machine, or both in server-client network environments. In an example, the machine 700 may act as a peer machine in peer-to-peer (P2P) (or other distributed) network environment. The machine 700 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

The embodiments and examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system) 700 (e.g., the host 105, the memory device 110 of FIG. 1, etc.) may include a processing device 702 (e.g., a hardware processor, a central processing unit (CPU), a graphics processing unit (GPU), a hardware processor core, or any combination thereof, such as a memory controller of the memory device 110, etc.), a main memory 704 (e.g., read-only memory (ROM), flash memory, dynamic random-access memory (DRAM) such as synchronous DRAM (SDRAM) or Rambus DRAM (RDRAM), etc.), a static memory 706 (e.g., flash memory, static random-access memory (SRAM), etc.), and a data storage system 718, some or all of which may communicate with each other via an interlink (e.g., bus) 730.

The processing device 702 can represent one or more general-purpose processing devices such as a microprocessor, a central processing unit, or the like. More particularly, the processing device 702 can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 702 can also be one or more special-purpose processing devices such as an application specific integrated circuit (ASIC), a field programmable gate array (FPGA), a digital signal processor (DSP), network processor, or the like. The processing device 702 can be configured to execute instructions 726 for performing the operations and steps discussed herein. The machine 700 can further include a network interface device 708 to communicate over a network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 or within the processing device 702 during execution thereof by the machine 700, the main memory 704 and the processing device 702 also constituting machine-readable storage media. The machine-readable storage medium 724, the data storage system 718, or the main memory 704 can correspond to the memory device 110 of FIG. 1. In one implementation, the instructions 726 include instructions 711 contained in firmware to implement functionality corresponding to disabling system brown out detection after a boot phase of the system is completed.

While the machine-readable storage medium 724 is shown in an example implementation to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media. In an example, a massed machine-readable medium comprises a machine-readable medium with a plurality of particles having invariant (e.g., rest) mass. Accordingly, massed machine-readable media are not transitory propagating signals. Specific examples of massed machine-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The machine 700 may further include a display unit, an alphanumeric input device (e.g., a keyboard), and a user interface (UI) navigation device (e.g., a mouse). In an example, one or more of the display unit, the input device, or the UI navigation device may be a touch screen display. The machine a signal generation device (e.g., a speaker), or one or more sensors, such as a global positioning system (GPS) sensor, compass, accelerometer, or one or more other sensor. The machine 700 may include an output controller, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The instructions 726 (e.g., software, programs, an operating system (OS), etc.) or other data are stored on the data storage device 718 can be accessed by the main memory 704 for use by the processing device 702. The main memory 704 (e.g., DRAM) is typically fast, but volatile, and thus a different type of storage than the data storage device 718 (e.g., an SSD), which is suitable for long-term storage, including while in an "off" condition. The instructions 726 or data in use by a user or the machine 700 are typically loaded in the main memory 704 for use by the processing device 702. When the main memory 704 is full, virtual space from the data storage device 718 can be allocated to supplement the main memory 704; however, because the data storage device 718 device is typically slower than the main memory 704, and write speeds are typically at least twice as slow as read speeds, use of virtual memory can greatly reduce user experience due to storage device latency (in contrast to the main memory 704, e.g., DRAM). Further, use of the data storage device 718 for virtual memory can greatly reduce the usable lifespan of the data storage device 718.

In contrast to virtual memory, virtual memory compression (e.g., the Linux™ kernel feature "ZRAM") uses part of the memory as compressed block storage to avoid paging to the data storage device 718. Paging takes place in the compressed block until it is necessary to write such data to the data storage device 718. Virtual memory compression increases the usable size of the main memory 704, while reducing wear on the data storage device 718.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host (e.g., a host device), and are often removable and separate components from the host. In contrast, eMMC™ devices are attached to a circuit board and considered a component of the host, with read speeds that rival serial ATA™ (Serial AT (Advanced Technology) Attachment, or SATA) based SSD devices. However, demand for mobile device performance continues to increase, such as to fully enable virtual or augmented-reality devices, utilize increasing networks speeds, etc. In response to this demand, storage devices have shifted from parallel to serial communication interfaces. Universal Flash Storage (UFS) devices, including controllers and firmware, communicate with a host using a low-voltage differential signaling (LVDS) serial interface with dedicated read/write paths, further advancing greater read/write speeds.

The instructions 724 may further be transmitted or received over a network 720 using a transmission medium via the network interface device 708 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 708 may include one or more physical jacks (e.g., Ethernet, coaxial, or phone jacks) or one or more antennas to connect to the network 720. In an example, the network interface device 708 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding, or carrying instructions for execution by the machine 700, and includes digital or analog communications signals or other intangible medium to facilitate communication of such software.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, unless stated otherwise the term "or" is used to refer to a nonexclusive or, such that "A or B" may include "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended. A system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

Operating a memory cell, as used herein, includes reading from, writing to, or erasing the memory cell. The operation of placing a memory cell in an intended state is referred to herein as "programming," and can include both writing to or erasing from the memory cell (e.g., the memory cell may be programmed to an erased state).

According to one or more embodiments of the present disclosure, a memory controller (e.g., a processor, controller, firmware, etc.) located internal or external to a memory device, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the memory device as they occur, tracking the operations of the memory device it initiates, evaluating the memory device characteristics corresponding to a wear state, etc.)

According to one or more embodiments of the present disclosure, a memory access device may be configured to provide wear cycle information to the memory device with each memory operation. The memory device control circuitry (e.g., control logic) may be programmed to compensate for memory device performance changes corresponding to the wear cycle information. The memory device may receive the wear cycle information and determine one or more operating parameters (e.g., a value, characteristic) in response to the wear cycle information.

Method examples described herein can be machine, device, or computer-implemented at least in part. Some examples can include a computer-readable medium, a device-readable medium, or a machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact discs and digital video disks), magnetic cassettes, memory cards or sticks, random access memories (RAMs), read only memories (ROMs), solid state drives (SSDs), Universal Flash Storage (UFS) device, embedded MMC (eMMC) device, and the like.

ADDITIONAL DESCRIPTION AND EXAMPLES

The above description is intended to be illustrative, and not restrictive. For example, the above-described examples (or one or more aspects thereof) may be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

Example 1 includes subject matter (such as a memory device) comprising a memory array including memory cells and a memory controller operatively coupled to the memory array. The memory controller includes an oscillator circuit, internal memory, a processor core, voltage detector circuitry and logic circuitry. The processor core is operatively coupled to the oscillator circuit and the internal memory and is configured to load operating firmware during a boot phase of the memory device. The voltage detector circuitry is configured to detect a decrease in a circuit supply voltage of the memory controller during the boot phase, and the logic circuitry is configured initiate a low power mode during the boot phase in response to detecting the decrease in the circuit supply voltage.

In Example 2, the subject matter of Example 1 optionally includes the logic circuitry configured to halt operation of the oscillator circuit and power down the processor core and internal memory when in the low power mode during the boot phase.

In Example 3, the subject matter of Example 2 optionally includes voltage detector circuitry configured to detect an increase in the circuit supply voltage after the detected decrease in circuit supply voltage, and the logic circuitry is configured to enable operation of the oscillator circuit and enable power to the processor core and the internal memory in response to the detected increase in the circuit supply voltage.

In Example 4, the subject matter of one or any combination of Examples 1-3 optionally includes voltage detector circuitry configured to detect the circuit supply voltage increasing after a device reset then decreasing during the boot phase.

In Example 5, the subject matter of one or any combination of Examples 1-4 optionally includes logic circuitry configured to disable the voltage decrease detection when the boot phase is completed.

In Example 6, the subject matter of one or any combination of Examples 1-5 optionally includes operating firmware that includes one or more instructions that, when executed by the processor core, cause the processor core to disable the voltage detector circuitry.

In Example 7, the subject matter of one or any combination of Examples 1-6 optionally includes a memory controller that includes peripheral circuitry used to communicate with the memory array, and the logic circuitry is configured to power down the peripheral circuitry during the boot phase in the low power mode.

In Example 8, the subject matter of one or any combination of Examples 1-7 optionally includes a memory controller included in an integrated circuit that includes an input/output (I/O) pad, and the logic circuitry is configured to halt operation of the oscillator circuit and power down the processor core and the internal memory during the boot phase in response to a signal received on the I/O pad.

In Example 9, the subject matter of one or any combination of Examples 1-8 optionally includes a memory controller that includes a reset pin and the logic circuitry is configured to halt operation of the oscillator circuit and power down the processor core and the internal memory during the boot phase in response to a signal received on the reset pin.

In Example 10, the subject matter of one or any combination of Examples 1-9 optionally includes a memory controller included in a first integrated circuit and the memory array is included in one more memory integrated circuits separate from the first integrated circuit.

Example 11 includes subject matter (such as a method of operating a memory device) or can optionally be combined with one or any combination of Examples 1-10 to include such subject matter, comprising initiating a boot phase of a memory controller of the memory device, wherein operating instructions are loaded into processing circuitry of the memory controller during the boot phase, detecting a decrease in a circuit supply voltage of the memory controller during the boot phase, and activating a low power mode of a memory controller in response to the detection of the decrease in the circuit supply voltage.

In Example 12, the subject matter of Example 11 optionally includes halting an oscillator circuit of the memory controller, and powering down processing circuitry, internal memory, and peripheral circuitry of the memory controller.

In Example 13, the subject matter of one or both of Examples 11 and 12 optionally includes maintaining the low power mode until detecting the circuit supply voltage stops decreasing, and deactivating the low power mode and resuming the boot phase in response to the detecting that the circuit supply voltage stops decreasing.

In Example 14, the subject matter of one or any combination of Example 11-13 optionally includes detecting the circuit supply voltage increasing after a device reset then decreasing during the boot phase.

In Example 15, the subject matter of one or any combination of Examples 11-14 optionally includes disabling the voltage decrease detection when the boot phase is completed.

In Example 16, the subject matter of one or any combination of Examples 11-15 optionally includes disabling the voltage decrease detection by the memory controller performing an instruction included in the loaded operating firmware.

In Example 17, the subject matter of one or any combination of Examples 11-16 optionally includes activating the low power mode of the memory controller during the boot phase in response to a signal applied to an input/output (I/O) pad of an integrated circuit that includes the memory controller.

In Example 18, the subject matter of one or any combination of Examples 11-17 optionally includes activating the low power mode of the memory controller during the boot phase in response to a signal applied to a reset pin of the memory controller.

Example 19 includes subject matter (such as an electronic system) or can optionally be combined with one or any combination of the Examples 1-18 to include such subject matter, comprising a power supply and multiple memory devices receiving power from the power supply. The memory devices include multiple memory dies and a memory controller operatively coupled to the memory dies. The memory controller includes processor core configured to execute instructions to control the multiple memory dies, voltage detector circuitry configured to detect a decrease in supply voltage to the memory controller during a boot phase of the memory devices, and logic circuitry configured to enter a low power mode in response to detecting the decrease in the supply voltage.

In Example 20, the subject matter of Example 19 optionally includes a memory controller that includes an oscillator circuit, internal memory, and a processor core configured to load operating firmware during a boot phase of the memory device; and the logic circuitry is configured to halt operation of the oscillator circuit and power down the processor core and the internal memory during the boot phase in the low power mode.

In Example 21, the subject matter of claim 20 optionally includes a memory controller includes a circuit supply pin and a test pin coupled to the external device, and the logic circuitry is configured to halt operation of the oscillator circuit and power down the processor core and the internal memory during the boot phase in response to a signal received on the test pin from the external device in response to a decrease in voltage on the circuit supply pin.

In Example 22, the subject matter of one or both of claims 20 and 21 optionally includes a memory controller that includes a reset pin coupled to the external device, and the logic circuitry is configured to halt operation of the oscillator circuit and power down the processor core and the internal memory during the boot phase in response to the voltage detector circuitry detecting that the circuit supply voltage increases after a reset signal is received from the external device and then decreases during the boot phase.

In Example 23, the subject matter of one or any combination of Examples 20-22 optionally includes voltage detector circuitry configured to detect an increase in the supply voltage after the detected decrease in the supply voltage, and the logic circuitry is configured to enable operation of the oscillator circuit and enable power to the processor core and the internal memory in response to the detected increase in the supply voltage.

Example 24 includes subject matter (such as an electronic system) or can optionally be combined with one or any combination of Examples 1-23 to include such subject matter, comprising a power supply, a power supply voltage monitor circuit, a system controller including processor circuitry including one or more processors, and multiple memory devices operatively coupled to the system controller and receiving power from the power supply. The memory devices include multiple memory dies and a memory controller operatively coupled to the memory dies. The memory controller including a processor core configured to execute instructions to control the memory dies. The system controller is configured to perform operations including providing a low power control signal to one or more memory devices in response to the power supply monitor circuit detecting a decrease in supply voltage of the power supply, and the memory controller of the one or more memory devices is configured to enter a low power mode in response to the low power control signal.

In Example 25, the subject matter of Example 24 optionally includes a memory controller that includes an oscillator circuit, internal memory, logic circuitry, and a processor core configured to load operating firmware during a boot phase of the memory device; and the logic circuitry is configured to halt operation of the oscillator circuit and power down the processor core and the internal memory during the boot phase in the low power mode.

These non-limiting Examples can be combined in any permutation or combination.

The invention claimed is:

1. A memory device comprising:
a memory array including memory cells;
a memory controller operatively coupled to the memory array and including:
an oscillator circuit;
internal memory;
a processor core operatively coupled to the oscillator circuit and the internal memory, and configured to load operating firmware during a boot phase of the memory device;
voltage detector circuitry configured to detect a decrease in a circuit supply voltage of the memory controller during the boot phase; and
logic circuitry configured to initiate a low power mode during the boot phase in response to detecting the decrease in the circuit supply voltage.

2. The memory device of claim 1, wherein the logic circuitry is configured to halt operation of the oscillator circuit and power down the processor core and internal memory when in the low power mode during the boot phase.

3. The memory device of claim 2, wherein the voltage detector circuitry is configured to detect an increase in the circuit supply voltage after the detected decrease in circuit supply voltage, and the logic circuitry is configured to enable operation of the oscillator circuit and enable power to the processor core and the internal memory in response to the detected increase in the circuit supply voltage.

4. The memory device of claim 1, wherein the voltage detector circuitry is configured to detect the circuit supply voltage increasing after a device reset then decreasing during the boot phase.

5. The memory device of claim 1, wherein the logic circuitry is configured to disable the voltage decrease detection when the boot phase is completed.

6. The memory device of claim 1, wherein the operating firmware includes one or more instructions that, when executed by the processor core, cause the processor core to disable the voltage detector circuitry.

7. The memory device of claim 1, wherein the memory controller includes peripheral circuitry used to communicate with the memory array, and the logic circuitry is configured to power down the peripheral circuitry during the boot phase in the low power mode.

8. The memory device of claim 1, wherein the memory controller is included in an integrated circuit that includes an input/output (I/O) pad, and the logic circuitry is configured to halt operation of the oscillator circuit and power down the processor core and the internal memory during the boot phase in response to a signal received on the I/O pad.

9. The memory device of claim 1, wherein the memory controller includes a reset pin and the logic circuitry is configured to halt operation of the oscillator circuit and power down the processor core and the internal memory during the boot phase in response to a signal received on the reset pin.

10. The memory device of claim 1, wherein the memory controller is included in a first integrated circuit and the memory array is included in one more memory integrated circuits separate from the first integrated circuit.

11. A method of operating a memory device, the method comprising:
initiating a boot phase of a memory controller of the memory device, wherein operating instructions are loaded into processing circuitry of the memory controller during the boot phase;
detecting a decrease in a circuit supply voltage of the memory controller during the boot phase; and
activating a low power mode of a memory controller in response to the detection of the decrease in the circuit supply voltage.

12. The method of claim 11, wherein the activating a low power mode includes halting an oscillator circuit of the memory controller, and powering down processing circuitry, internal memory, and peripheral circuitry of the memory controller.

13. The method of claim 11, including:
maintaining the low power mode until detecting the circuit supply voltage stops decreasing; and
deactivating the low power mode and resuming the boot phase in response to the detecting that the circuit supply voltage stops decreasing.

14. The method of claim 11, wherein detecting the decrease in the circuit supply voltage includes detecting the circuit supply voltage increasing after a device reset then decreasing during the boot phase.

15. The method of claim 11, including disabling the voltage decrease detection when the boot phase is completed.

16. The method of claim 11, including disabling the voltage decrease detection by the memory controller performing an instruction included in the loaded operating firmware.

17. The method of claim 11, including activating the low power mode of the memory controller during the boot phase in response to a signal applied to an input/output (I/O) pad of an integrated circuit that includes the memory controller.

18. The method of claim 11, including activating the low power mode of the memory controller during the boot phase in response to a signal applied to a reset pin of the memory controller.

19. An electronic system comprising:
a power supply; and
multiple memory devices receiving power from the power supply, the memory devices including:
multiple memory dies; and
a memory controller operatively coupled to the memory dies, the memory controller including:
a processor core configured to execute instructions to control the multiple memory dies;
voltage detector circuitry configured to detect a decrease in supply voltage to the memory controller during a boot phase of the memory devices; and
logic circuitry configured to enter a low power mode in response to detecting the decrease in the supply voltage.

20. The electronic system of claim 19, wherein the memory controller includes:
an oscillator circuit;
internal memory; and
wherein the processor core is configured to load operating firmware during a boot phase of the memory device; and the logic circuitry is configured to halt operation of the oscillator circuit and power down the processor core and the internal memory during the boot phase in the low power mode.

21. The electronic system of claim 20, wherein the memory controller includes a circuit supply pin and a test pin coupled to the external device, and the logic circuitry is configured to halt operation of the oscillator circuit and power down the processor core and the internal memory during the boot phase in response to a signal received on the test pin from the external device in response to a decrease in voltage on the circuit supply pin.

22. The electronic system of claim 20, wherein the memory controller includes a reset pin coupled to the external device, and the logic circuitry is configured to halt operation of the oscillator circuit and power down the processor core and the internal memory during the boot phase in response to the voltage detector circuitry detecting that the circuit supply voltage increases after a reset signal is received from the external device and then decreases during the boot phase.

23. The electronic system of claim 20, wherein the voltage detector circuitry is configured to detect an increase in the supply voltage after the detected decrease in the supply voltage, and the logic circuitry is configured to enable operation of the oscillator circuit and enable power to the processor core and the internal memory in response to the detected increase in the supply voltage.

24. An electronic system comprising:
a power supply;
a power supply voltage monitor circuit;
a system controller including processor circuitry including one or more processors; and
multiple memory devices operatively coupled to the system controller and receiving power from the power supply, the memory devices including:
multiple memory dies; and
a memory controller operatively coupled to the memory dies, the memory controller including a processor core configured to execute instructions to control the memory dies;
wherein the system controller is configured to perform operations including:
providing a low power control signal to one or more memory devices in response to the power supply monitor circuit detecting a decrease in supply voltage of the power supply; and
wherein the memory controller of the one or more memory devices is configured to enter a low power mode in response to the low power control signal.

25. The electronic system of claim 24, wherein the memory controller includes:
an oscillator circuit;
internal memory;
logic circuitry; and
wherein the processor core is configured to load operating firmware during a boot phase of the memory device; and the logic circuitry is configured to halt operation of the oscillator circuit and power down the processor core and the internal memory during the boot phase in the low power mode.

* * * * *